(12) United States Patent
Cho

(10) Patent No.: US 7,558,932 B2
(45) Date of Patent: Jul. 7, 2009

(54) SEMICONDUCTOR MEMORY DEVICE AND METHOD FOR OPERATING THE SAME

(75) Inventor: Ho-Youb Cho, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 310 days.

(21) Appl. No.: 11/714,665

(22) Filed: Mar. 6, 2007

(65) Prior Publication Data
US 2008/0002484 A1    Jan. 3, 2008

(30) Foreign Application Priority Data
Jun. 30, 2006    (KR) .................... 10-2006-0061358

(51) Int. Cl.
*G06F 13/00* (2006.01)
(52) U.S. Cl. ..................... 711/167; 711/105
(58) Field of Classification Search ............... 711/167, 711/105, 5, 111; 365/193, 194, 233.13
See application file for complete search history.

(56) References Cited

U.S. PATENT DOCUMENTS

| | | | |
|---|---|---|---|
| 6,564,287 B1 | 5/2003 | Lee | |
| 6,636,446 B2 | 10/2003 | Lee et al. | |
| 6,851,032 B2 * | 2/2005 | LaBerge et al. | ............. 711/167 |
| 7,055,012 B2 | 5/2006 | LaBerge et al. | |
| 2005/0105363 A1 | 5/2005 | Ko | |
| 2005/0201183 A1 | 9/2005 | Ho | |

FOREIGN PATENT DOCUMENTS

| | | |
|---|---|---|
| JP | 11-203859 | 7/1999 |
| KR | 10-2005-0011954 | 1/2005 |
| KR | 10-2005-0035637 | 4/2005 |
| KR | 10-2007-0036573 | 4/2007 |
| KR | 10-2007-0036637 | 4/2007 |

* cited by examiner

*Primary Examiner*—Vu A Le
(74) *Attorney, Agent, or Firm*—Blakely, Sokoloff, Taylor & Zafman LLP

(57) ABSTRACT

A read command AL shifting unit shifts a read command for a predetermined additive latency, to output a shifted read command. A write command AL shifting unit shifts a write command for the predetermined additive latency to output a first shifted write command. A write command CL shifting unit shifts the first shifted write command for a predetermined cas latency to output a second shifted write command. A write address controller generates an address control signal in response to the shifted read command and the first shifted write command. An address transfer circuit transfers an address in response to the address control signal. Other embodiments are also described.

22 Claims, 9 Drawing Sheets

US 7,558,932 B2

SEMICONDUCTOR MEMORY DEVICE AND METHOD FOR OPERATING THE SAME

CROSS-REFERENCE TO RELATED APPLICATIONS

The present invention claims priority of Korean patent application no. 10-2006-61358, filed in the Korean Patent Office on Jun. 30, 2006, which is incorporated by reference in its entirety.

BACKGROUND OF THE INVENTION

The present invention relates to a semiconductor memory device, more particularly, to a synchronous semiconductor memory device with an additive latency and a cas latency.

A semiconductor memory device in a system which includes a plurality of semiconductor devices is used for storing data. The semiconductor memory device outputs data stored in a cell corresponding to an address outputted from a data requesting unit, e.g., a central processing unit, or stores data provided from the data requesting unit into the cell.

As an operational speed of a system including a plurality of semiconductor devices has increased and a technology related with a semiconductor integrated circuit has advanced, there has been a demand for increasing data access speed of the semiconductor memory device. In order to access data of semiconductor memory devices at a high speed, a synchronous memory device which receives a system clock and can access data synchronized with transition of the received system clock, is proposed. Nevertheless, the synchronous memory device often cannot meet the data access speed required by the system, and in particular, the data requesting unit included in the system. Accordingly, a double data rate (DDR) synchronous semiconductor memory device is proposed which can access data on every rising edge and falling edge of the system clock.

The DDR synchronous semiconductor memory device should receive or output two data within one cycle of the system clock, since the DDR synchronous semiconductor memory device accesses one data every transition of the system clock. That is, the DDR synchronous semiconductor memory device should output or receive data every time exactly synchronized with the rising edge and falling edge of the system clock.

In order to increase data access speed of the DDR synchronous semiconductor memory device, there are various specifications about timing margins required for receiving a command and accessing data corresponding to the received command. For example, typically, The DDR synchronous semiconductor memory device has specifications such as additive latency (AL) and cas latency (CL). The additive latency is a time margin from when a write or read command is inputted into the DDR synchronous semiconductor memory device, to when an operation corresponding to the inputted write or read command is started at a predetermined time. Also, an address is inputted into the DDR synchronous semiconductor memory device with the inputted write or read command. The cas latency is a time margin from when an operation corresponding to the inputted write or read command is started at a predetermined time, to when data corresponding to the inputted write or read command is inputted into or outputted from the DDR synchronous semiconductor memory device.

Generally, when a write command is carried out in the DDR synchronous semiconductor memory device, in order to harmonize an input time of data inputted into a core area with an input time of a corresponding read command and a corresponding address into the core area, the corresponding write command and the corresponding address are delayed for the additive latency and the cas latency and then, inputted to the core area. Typically, the corresponding write command and the corresponding address are shifted for cycles of an internal clock corresponding to the additive latency and the cas latency.

Alternatively, when a read command is carried out in the DDR synchronous semiconductor memory device, in order to harmonize an output time of data outputted from the core area with an input time of a corresponding read command and a corresponding address into the core area, the corresponding read command and the corresponding address are merely delayed for the additive latency and then, inputted to the core area. Also, the corresponding read command and the corresponding address are shifted for cycles of an internal clock corresponding to the additive latency.

Typically, a data signal stored in a cell of the core area is too small to output it into an external circuit. A data signal stored in a cell corresponding to the read command should be sensed and amplified by a sense amplifier. On a read command, a time corresponding to a cas latency is used for sensing and amplifying a data corresponding to the read command. Hence, the corresponding read command and the corresponding address are not delayed by the cas latency and only delayed by the additive latency into the core area.

FIG. 1 shows a block diagram of a conventional semiconductor memory device. The conventional semiconductor memory device includes a command processing circuit and an address transfer circuit. The command processing circuit includes a command buffer 114, a command decoder 116, a read command AL shifting unit 118, a write command shifting unit 120 and a write address controller 122. The address transfer circuit includes an address buffer 102, an address latch 104, an AL shifting unit 106, a CL shifting unit 110, an address shifting clock generating unit 108 and a column line selecting unit 112.

The command buffer 114 receives command signals RASB, CASB, WEB, and CSB to output command signals RAS, CAS, WE, and CS. The command decoder 116 decodes the command signals RAS, CAS, WE, and CS to generate column command signals, e.g., an access command signal IRDWT, a read command signal ERD, and a write command signal EWT. The read command AL shifting unit 118 shifts the read command signal ERD for periods of an internal clock BCK corresponding to an additive latency AL<0:6> to output a shifted read command signal IRDP. The write command shifting unit 120 shifts the write command signal EWT for periods of an internal clock BCK corresponding to the additive latency AL<0:6> and a cas latency CL<2:7>. The write address controller 122 generates an address control signal EWTS in response to the write command signal EWT and the shifted read command signal IRDP.

The address buffer 102 receives an address signal ADD to output an internal address LA. The address latch 104 latches the internal address LA to output a latched address LAI in response to the access command signal IRDWT. The access command signal IRDWT is a control signal activated in response to either the read command signal ERD or the write command signal EWT. The address shifting clock generating unit 108 generates an address shifting clock BCKD and a write address shifting clock BCKDWT using the internal clock BCK in response to the address control signal EWTS. The AL shifting unit 106 shifts the latched address signal LAI for periods of the address shifting clock BCKD corresponding to the additive latency AL<0:6> to output a read address RDLA. The CL shifting unit 110 shifts the read address RDLA for periods of the write address shifting clock BCKDWT corresponding to the cas latency CL<2:7> to output a write address WTLA. The column line selecting unit 112 generates a selecting signal CAI for selecting one or more of column lines, e.g., bit lines with using the read address RDLA or the write address WTLA in response to the shifted read command signal IRDP or the shifted write command signal IWTP.

FIG. 2 shows a waveform diagram representing an operation of the conventional semiconductor memory device in FIG. 1. When processing a write command, at first, the write command signal EWT generated by the command decoder 116 is outputted to the write address controller 122 and the write command shifting unit 120, respectively. The shifted write command signal IWTP is generated by the write command shifting unit 120. The shifted write command signal IWTP is a signal generated by shifting the writing command signal EWT during a predetermined period corresponding to the additive latency AL<0:6> and the cas latency CL<2:7>. The address control signal EWTS generated by the write address controller 122 is outputted to the address shifting clock generating unit 108. Then, the address shifting clock generating unit 108 generates the address shifting clock BCKD and the write address shifting clock BCKDWT. On the other hand, an address signal corresponding to the write command is inputted to the address buffer 102 and the inputted address is inputted to the AL shifting unit 106 through the address latch 104 as a latched address LAI. The inputted address is shifted by the AL shifting unit 106 and the CL shifting unit 110 and the shifted address, i.e., the write address WTLA is inputted into the column line selecting unit 112. One or more of the column lines in a cell area of the semiconductor memory device is selected by the write address WTLA in response to the shifted write command signal IWTP inputted to the column line selecting unit 112. Data corresponding to the write command is stored at cells of the selected column lines.

When processing a read command, at first, the read command signal ERD generated by the command decoder 116 is outputted to the read command AL shifting unit 118. The shifted read command signal IRDP is generated by the read command AL shifting unit 118. Then, the address control signal EWTS inactivated by the shifted read command signal IRDP is inputted into the write address controller 122. The write address shifting clock BCKDWT is disabled by the inactivated address control signal EWTS. On the other hand, an address signal corresponding to the read command is inputted to the address buffer 102 and the inputted address is inputted to the AL shifting unit 106 through the address latch 104 as a latched address LAI. The inputted address is shifted by the AL shifting unit 106 and the shifted address, i.e., the read address RDLA is inputted into the column line selecting unit 112. In that case, the CL shifting unit is disabled. One or more of the column lines in the cell area is selected by the read address RDLA inputted into the column line selecting unit 112 in response to the shift read command signal IRDP Data stored in cells of the selected column lines is outputted into the external circuit as output data corresponding to the read command.

In case that a read command and a write command are continuously inputted and executed, in other words, a read to write command execution, because of the prior command, i.e., the read command, an address corresponding to the following command, i.e., the write command, can not be transferred into the column line selecting unit 112. That is, if the shifted read command signal IRDP corresponding to the read prior command is activated later than the writing command signal EWT corresponding to the following write command, the shifted read command signal IRDP inactivates the address control signal EWTS which is used for generating the write address shifting clock BCKDWT corresponding to the following write command. Thus, as a result, the write address shifting clock BCKDWT is inactivated and the address corresponding to the write command can not transferred to the column line selecting unit 112 because the CL shifting unit 110 is disabled. In detail, that situation is occurred in case that BL/2+2<=AL. The BL means a burst length representing the number of data accessed corresponding to a command. For example, if BL is 4, AL is one of 4, 5, and 6 or if BL is 8, AL is 6.

SUMMARY OF THE INVENTION

Embodiments of the present invention are directed to provide a semiconductor memory device with ability to access data without error at a read to write command execution and a method for operating the same.

In accordance with an aspect of the present invention, there is provided a semiconductor memory device that includes a read command AL shifting unit shifting a read command for a predetermined additive latency, to output a shifted read command; a write command AL shifting unit shifting a write command for the predetermined additive latency, to output a first shifted write command; a write command CL shifting unit shifting the first shifted write command for a predetermined cas latency, to output a second shifted write command; a write address controller generating an address control signal in response to the shifted read command and the first shifted write command; and an address transfer circuit transferring an address in response to the address control signal.

In accordance with another aspect of the present invention, there is provided a semiconductor memory device includes a read command AL shifting unit shifting a read command for a predetermined additive latency to output a shifted read command; a write command shifting unit shifting a write command for the predetermined additive latency and a predetermined cas latency to output a shifted write command; a write address controller generating an address control signal in response to the shifted read command and the write command wherein if a value of the additive latency is more than a value of BL/2+2 (BL means a predetermined burst length), the address control signal is maintained in an activated state regardless of the state of shifted read command; and an address transfer circuit transferring an address in response to the address control signal.

In accordance with another aspect of the present invention, there is provided a method for operating a semiconductor memory device includes shifting a read command for a predetermined additive latency to output a shifted read command; shifting a write command for the predetermined additive latency to output a first shifted write command; shifting the first shifted write command for a predetermined cas latency to output a second shifted write command; generating an address control signal in response to the shifted read command and the first shifted write command; and transferring an address in response to the address control signal.

DESCRIPTION OF SPECIFIC EMBODIMENTS

Figure 1:
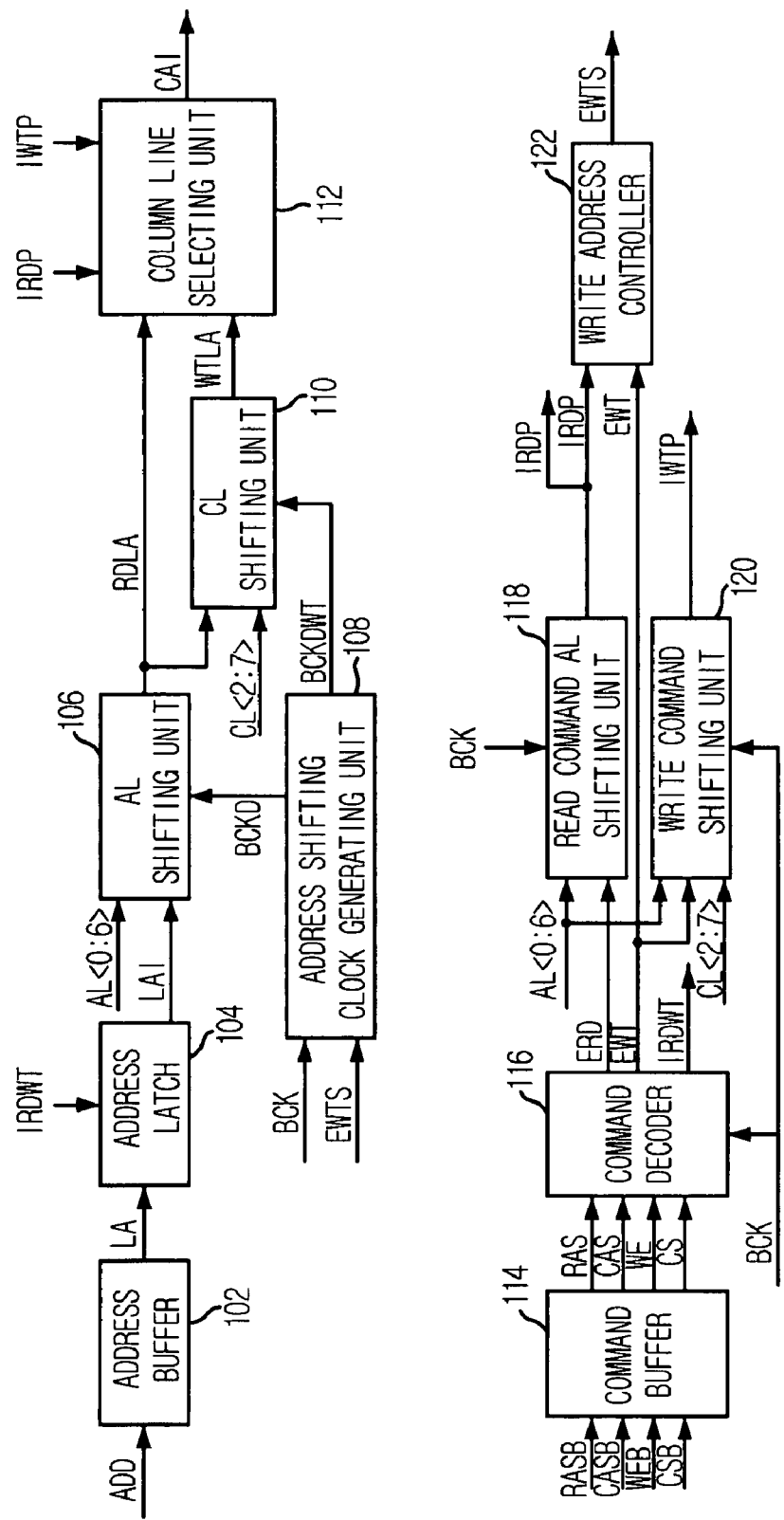
FIG. 1 shows a block diagram of a conventional semiconductor memory device.
Figure 2:
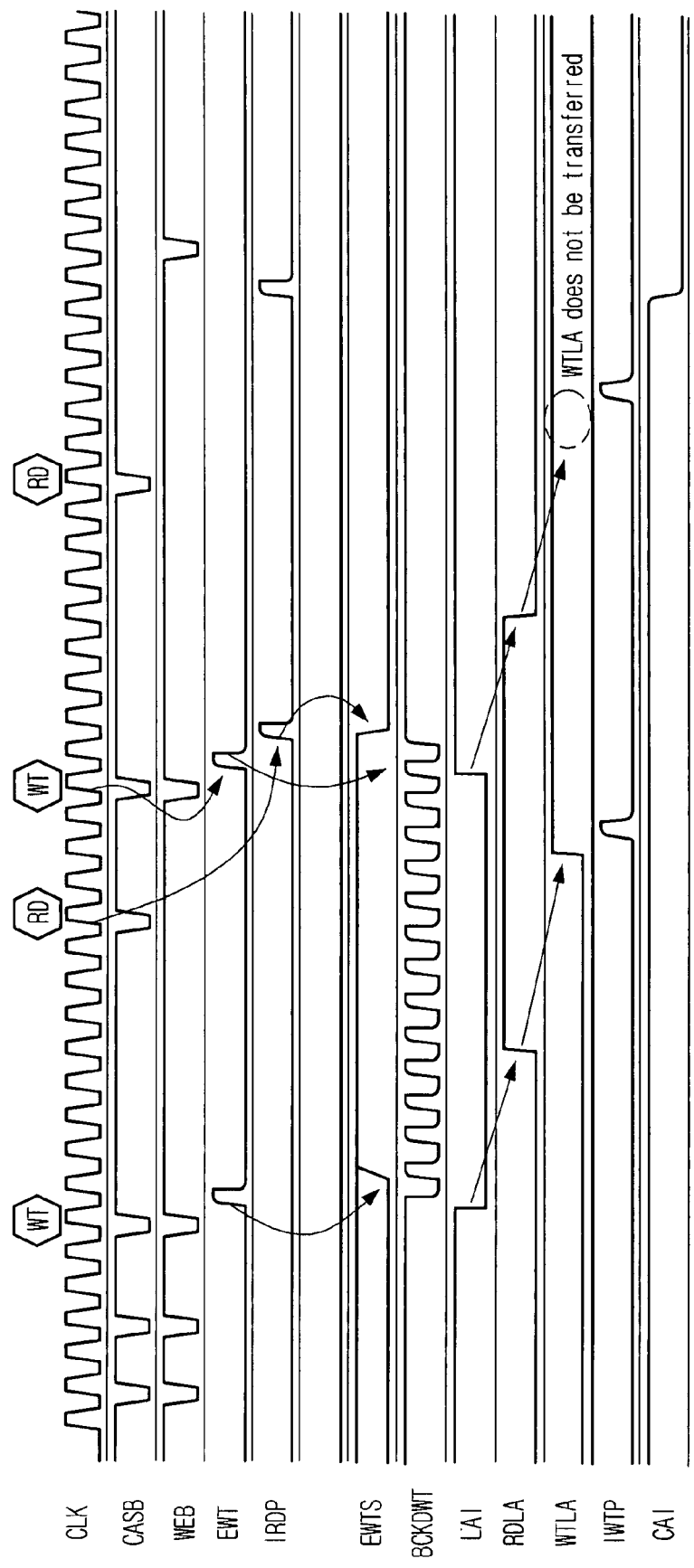
FIG. 2 shows a waveform diagram representing an operation of the conventional semiconductor memory device in FIG. 1.
Figure 3:
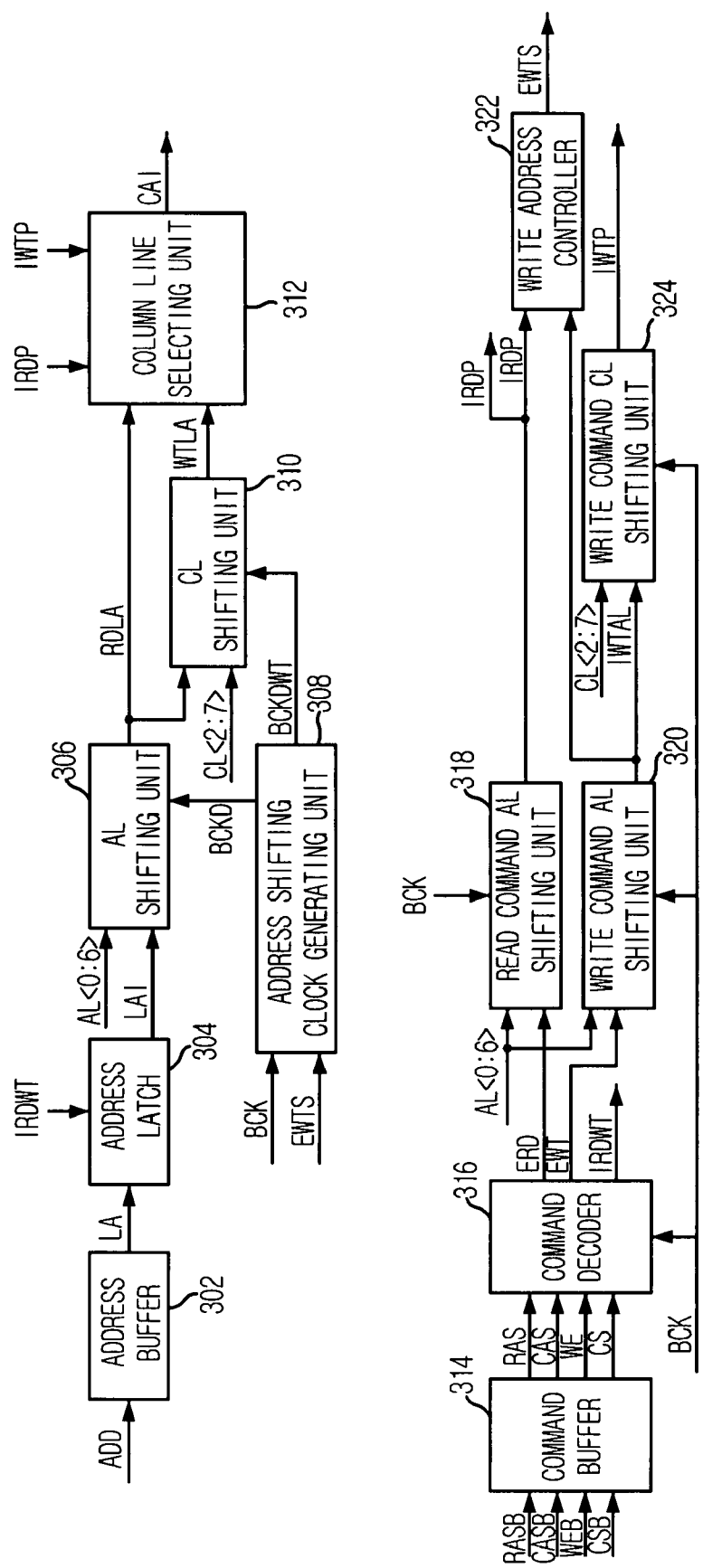
FIG. 3 shows a block diagram of a first exemplary embodiment of a semiconductor memory device in accordance to the present invention.

FIG. 3 shows a block diagram of a first exemplary embodiment of a semiconductor memory device in accordance to the present invention. The semiconductor memory device has a command process circuit including a command buffer 314, a command decoder 316, a read command AL shifting unit 318, a write command AL shifting unit 320, a write command CL shifting unit 324, and a write address controller 322 and a address transfer circuit including an address buffer 302, an address latching unit 304, an address shifting clock generating unit 308, a CL shifting unit 306, a CL shifting unit 310, a column line selecting unit 312.

The command buffer 314 receives command signals RASB, CASB, WEB, and CSB to output command signals RAS, CAS, WE, and CS. The command decoder 316 decodes the command signals RAS, CAS, WE, and CS to generate column command signals, e.g., an access command signal IRDWT, a read command signal ERD, and a write command signal EWT. The read command AL shifting unit 318 shifts the read command signal ERD for periods of an internal clock BCK corresponding to an additive latency AL<0:6>, to output a shifted read command signal IRDP. The write command AL shifting unit 320 shifts a write command signal EWT for periods of an internal clock BCK corresponding to the additive latency AL<0:6>, to output a first shifted write command signal IWTAL. The write command AL shifting unit 320 includes a shifting register for shifting the write command signal EWT to output a first shifted write command signal IWTAL synchronized to an internal clock BCK. The write command CL shifting unit 324 shifts the first shifted write command signal EWT for periods of an internal clock BCK corresponding to a predetermined cas latency CL<2:7>, to output a second shifted write command signal IWTP. The write address controller 322 generates an address control signal EWTS in response to the first shifted write command signal IWTAL and the shifted read command signal IRDP.

The address buffer 302 receives an address signal ADD to output an internal address LA. The address latch 304 latches the internal address LA to output a latched address LAI in response to the access command signal IRDWT. The access command signal IRDWT is activated in response to either the read command signal ERD or the write command signal EWT. The address shifting clock generating unit 308 generates an address shifting clock BCKD and a write address shifting clock BCKDWT with using the internal clock BCK in response to the address control signal EWTS. The AL shifting unit 306 shifts the latched address signal LAI for periods of the address shifting clock BCKD corresponding to the additive latency AL<0:6>, to output a read address RDLA. The CL shifting unit 310 shifts the read address RDLA for periods of the write address shifting clock BCKDWT corresponding to the predetermined cas latency CL<2:7>, to output a write address WTLA. The column line selecting unit 312 generates a selecting signal CAI for selecting one or more of column lines, e.g., bit lines, using the read address RDLA or the write address WTLA in response to the shifted read command signal IRDP or the second shifted write command signal IWTP.

Figure 4:
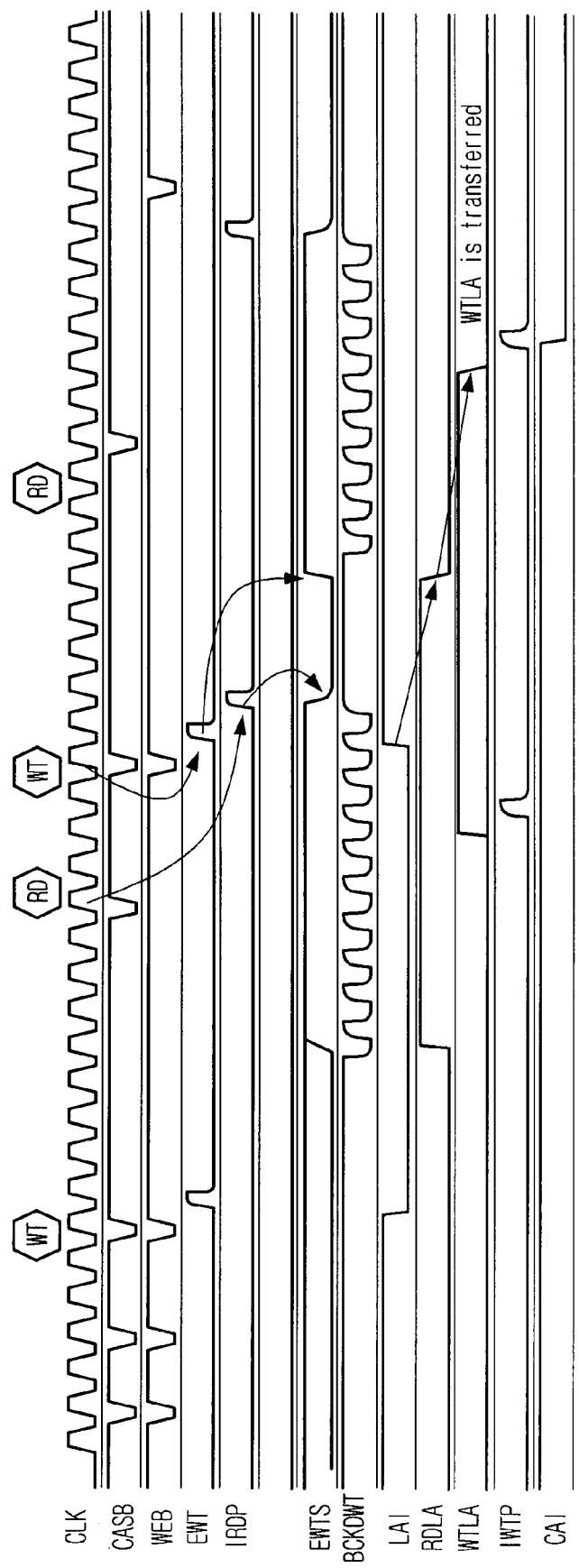
FIG. 4 shows a waveform diagram representing an operation of the semiconductor memory device in FIG. 3.

FIG. 4 shows a waveform diagram representing an operation of the semiconductor memory device in FIG. 3. When processing a write command, at first, the write command signal EWT generated by the command decoder 316 is outputted to the write command AL shifting unit 320. A first shifted write command signal IWTAL generated by the write command AL shifting unit 320 is inputted to the write command CL shifting unit 324 and the write address controller 322. A second shifted write command signal IWTP is generated by the write command CL shifting unit 324. The first shifted write command signal IWTP is a signal generated by shifting the writing command signal EWT during a predetermined period of the internal clock BCK corresponding to the additive latency AL<2:7>. The shifted write command signal IWTP is a signal generated by shifting the writing command signal EWT for predetermined periods of the internal clock BCK corresponding to the cas latency CL<2:7>.

The address control signal EWTS generated by the write address controller 322 is outputted to the address shifting clock generating unit 308. Then, the address shifting clock generating unit 308 generates the address shifting clock BCKD and the write address shifting clock BCKDWT. On the other hand, an address signal corresponding to the write command is inputted to the address buffer 302, and the inputted address is inputted to the AL shifting unit 306 through the address latch 304 as a latched address LAI. The inputted address is shifted by the AL shifting unit 306 and the CL shifting unit 310, and the shifted address, i.e., the write address WTLA, is inputted into the column line selecting unit 312. One or more of the column lines in a cell area of the semiconductor memory device is selected by the shifted write command signal IWTP inputted to the column line selecting unit 112. Data inputted by the write command is stored at cells of the selected column lines.

When processing a read command, the read command signal ERD generated by the command decoder 316 is outputted to the read command AL shifting unit 318. The shifted read command signal IRDP is generated by the read command AL shifting unit 318. The address control signal EWTS inactivated by the shifted read command signal IRDP is inputted into the write address controller 322. The write address shifting clock BCKDWT is disabled by the inactivated address control signal EWTS, into the address shifting clock generating unit 808. On the other hand, an address signal corresponding to the read command is inputted to the address buffer 302, and the inputted address is inputted to the AL shifting unit 306 through the address latch 304 as a latched address LAI. The inputted address is shifted by the AL shifting unit 306, and the shifted address, i.e., the read address RDLA, is inputted into the column line selecting unit 312. In this case, the CL shifting unit 310 is disabled. One or more of the column lines in the cell area is selected by the read address RDLA in response to the read address RDLA. Data stored in cells of the selected column lines is outputted into the external circuit, as output data corresponding to the read command.

In the case of a read to write command being executed, because of difference of address transfer path for a write command and a read command, an address corresponding to the following write command may not be transferred into a predetermined block, i.e., the column line selecting unit 312. However, in the semiconductor memory device according to the present invention, a prior address corresponding to the prior read command, and a following address corresponding to the following write command, can be transferred into the column line selecting unit 112 with reliability. In the semiconductor memory device according to the present invention, because the write address controller 322 receives the shifted read command signal IRDP and the first shifted write command signal IWTAL each of which is shifted for the additive latency AL<0:6>, respectively, the shifted read command signal IRDP corresponding to the prior read command can not be activated later than the first shifted write command signal IWTAL corresponding to the following write command. Then, the address control signal EWTS activated by the first shifted write command signal IWTAL can be maintained in an inactive state for a predetermined period corresponding to the additive latency AL<0:6>. Therefore, the write address shifting clock BCKDWT can not be inactivated when an inputted address is transferred into the column line selecting unit 312 through the AL shifting unit 306 and the CL shifting unit 310. When processing the read to write command, regardless of difference of address transfer path for a write command and a read command, an address corresponding to the following write command can be confidently transferred into a predetermined block in the semiconductor memory device according to the present invention.

Figure 5:
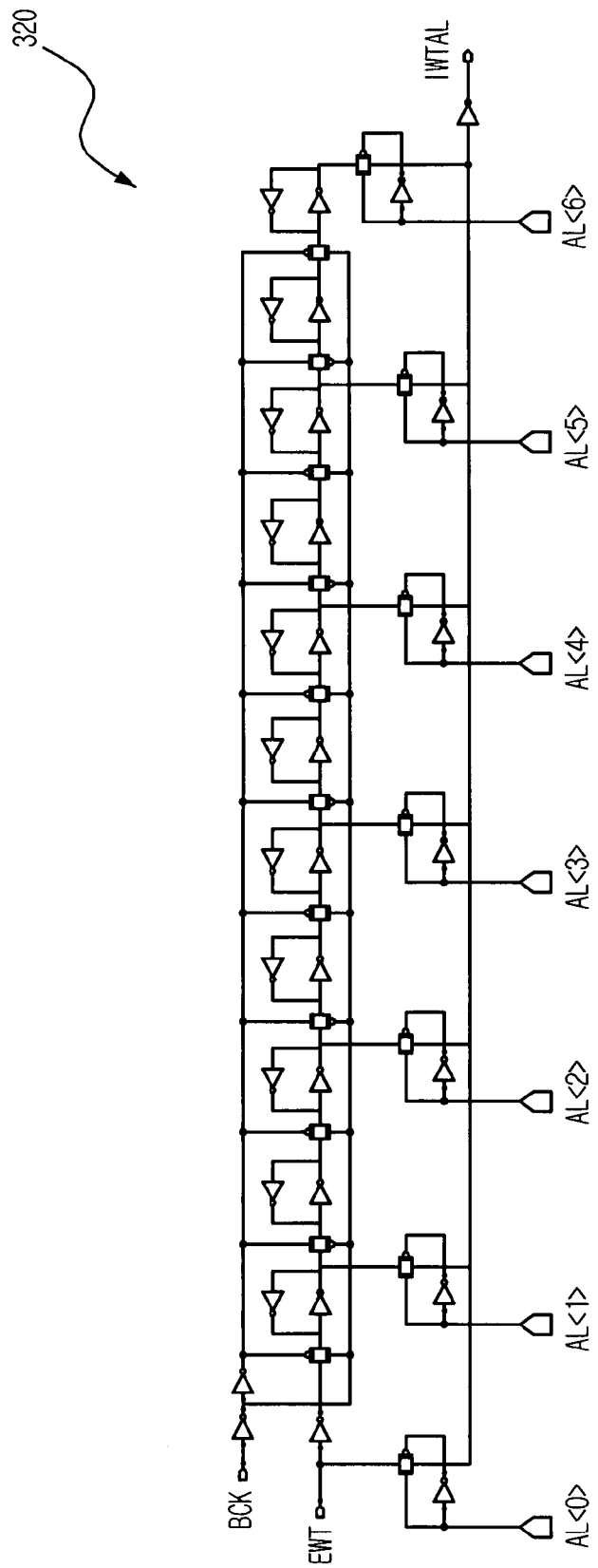
FIG. 5 shows a schematic diagram of the write command AL shifting unit in FIG. 3.

FIG. 5 shows a schematic diagram of the write command AL shifting unit 320 of FIG. 3. The write command AL shifting unit 320 includes a plurality of shifting registers for shifting the write command signal EWT synchronized in the internal clock BCK. The shifting register receives one of several signals having information of the additive latency AL<0:6>.

Figure 6:
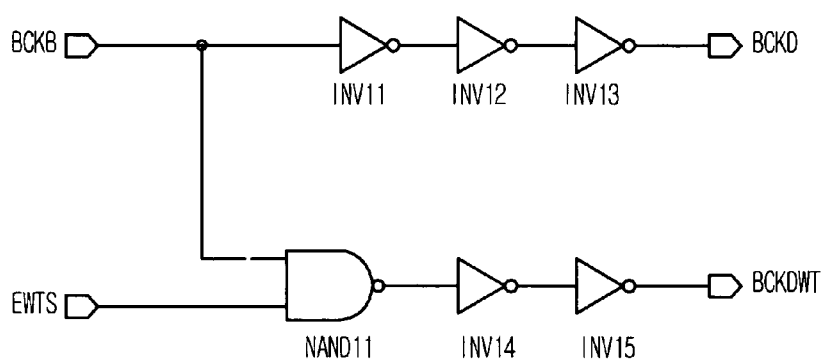
FIG. 6 shows a schematic diagram of the address shifting clock generating unit in FIG. 3.

FIG. 6 shows a schematic diagram of the address shifting clock generating unit in FIG. 3. The address shifting clock generating unit 308 includes a first inverter INV11 for inverting an inverting signal BCKB of the internal clock BCK, a second inverter INV12 for inverting an output signal of the first inverter INV11, a third inverter INV13 for inverting an output signal of the second inverter INV12, a first NAND logic gate NAND11 for carrying out a NAND logic operation of the inverting signal BCKB and the address control signal EWTS, a fourth inverter INV14 for inverting an output of the NAND logic gate NAND11, and a fifth inverter INV15 for inverting an output of the fourth inverter INV14 to output the write address shifting clock BCKDWT.

Figure 7:
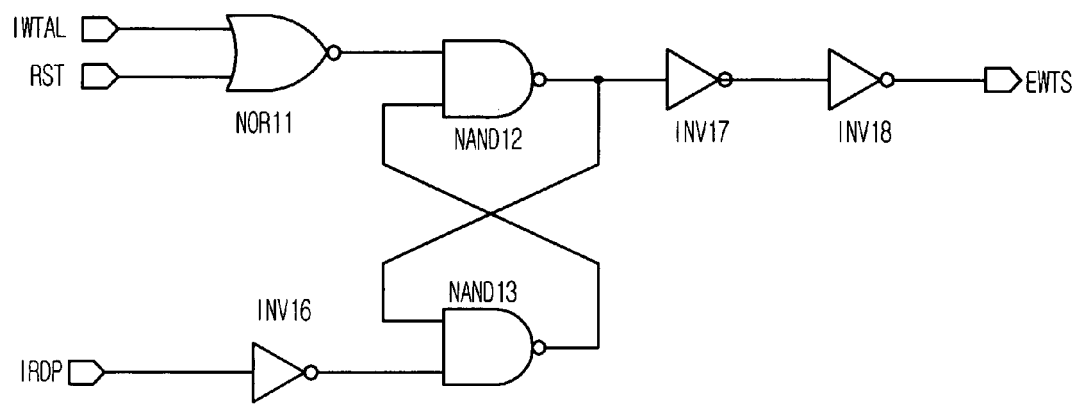
FIG. 7 shows a schematic diagram of the write address controller in FIG. 3

FIG. 7 shows a schematic diagram of the write address controller in FIG. 3. The write address controller 322 includes a first NOR logic gate NOR11 for carrying out a NOR logic operation of the first shifted write command signal IWTAL and an initial reset signal RST, a sixth inverter INV16 for inverting an output of the shifted read command signal IRDP, a second NAND logic gate NAND 12 having one input terminal connected to an output of the first NOR logic gate NOR11, a third NAND logic gate NAND13 having one input terminal connected to an output of the sixth inverter INV16, and the other input terminal connected to an output of the second NAND logic gate. NAND12, and an output terminal connected to the other input terminal of the second NAND logic NAND 13, a seventh inverter for inverting an output of the second NAND logic gate, and an eighth inverter INV17 for inverting an output of the seventh inverter INV18 to output the address control signal EWTS.

Figure 8:
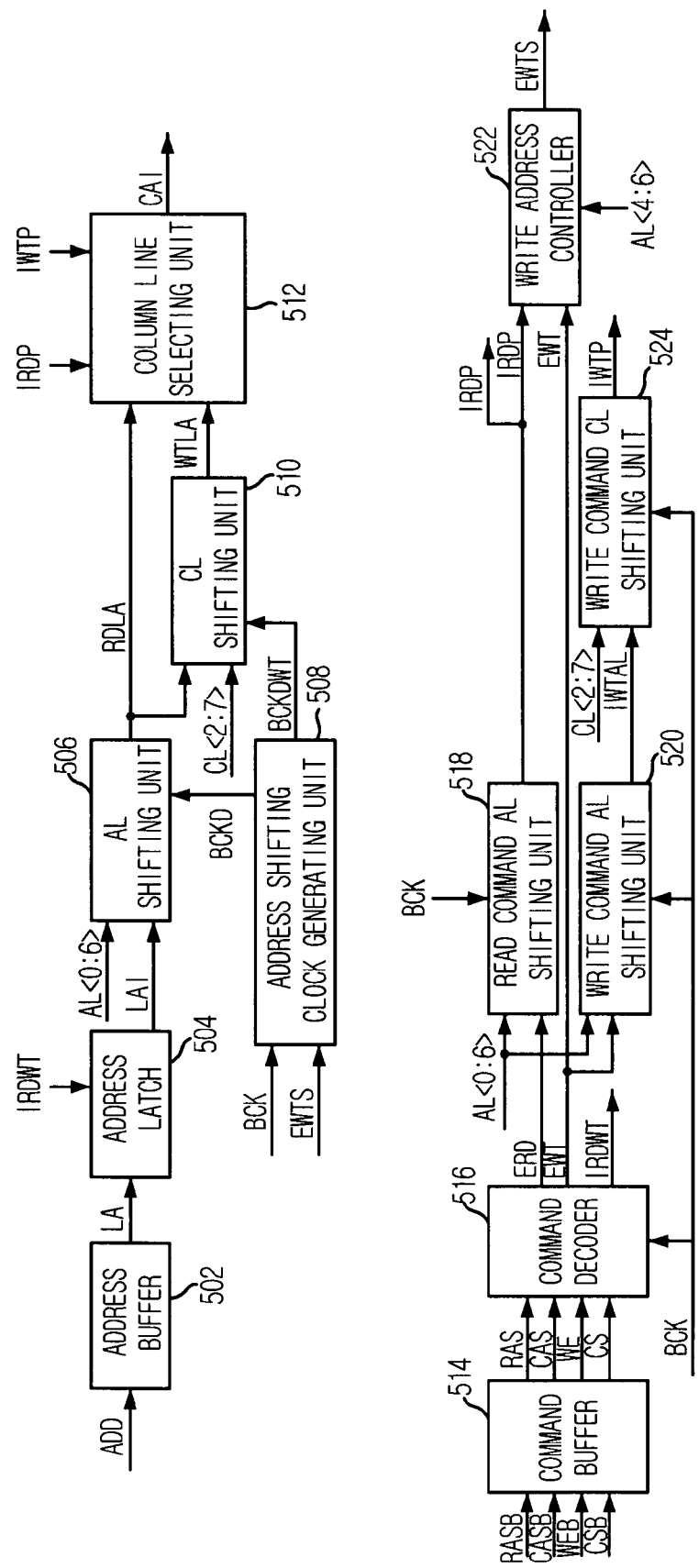
FIG. 8 shows a block diagram of a second exemplary embodiment of a semiconductor memory device in accordance to the present invention.

FIG. 8 shows a block diagram of a second exemplary embodiment of a semiconductor memory device in accordance to the present invention. The semiconductor memory device has a similar configuration as the semiconductor memory device according to the first exemplary embodiment in FIG. 3. The difference between the semiconductor memory device of FIG. 3 and the semiconductor memory device of FIG. 8 lies in the operation of the write address controller 522.

The write address controller 522 of FIG. 8 generates an address control signal EWTS in response to the shifted read command signal IRDP and the write command signal EWT wherein if a value of the additive latency is more than a value of BL/2+2 (BL means a predetermined burst length), the address control signal EWTS is maintained in an active state regardless of the state of the shifted read command signal IRDP. In the case of the read to write command, although the shifted read command signal IRDP corresponding to the prior read command is activated later than the address control signal EWTS corresponding to the following write command, the write address controller 522 maintains the activated state of the address control signal EWTS depending on a value of the additive latency AL<4:6>. Especially, this operation is executed in case that a value of the additive latency AL<4:6> is greater than a value of BL/2+2. For example, if BL is 4, AL is one of 4, 5, and 6, or if BL is 8, AL is 6. Therefore, although the shifted read command signal IRDP corresponding to the prior read command is activated later than the address control signal EWTS corresponding to the following write command, the write address shifting clock BCKDWT is not inactivated, because of the activated state of the address control signal EWTS.

Figure 9:
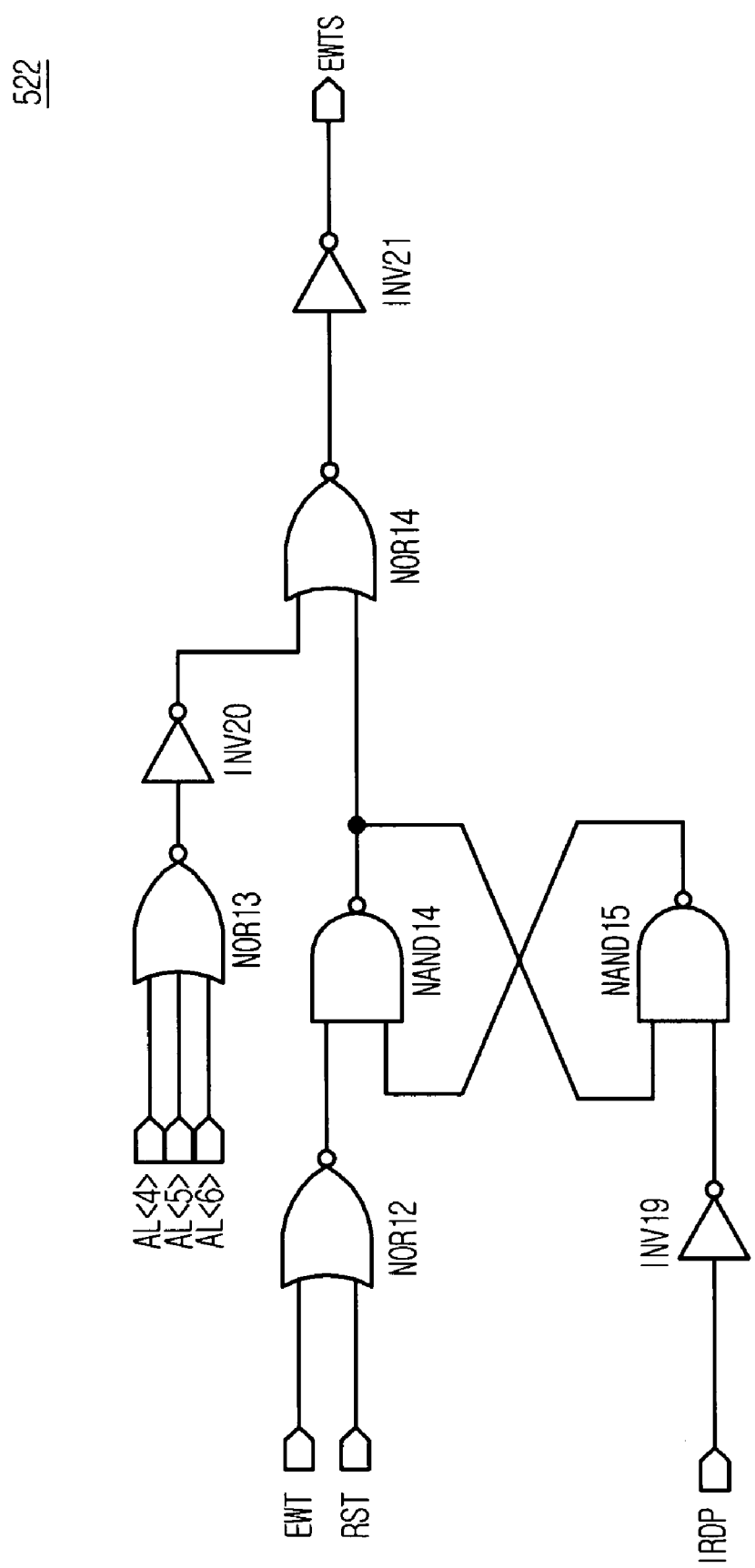
FIG. 9 shows a schematic diagram of the write address controller in FIG. 8.

FIG. 9 shows a schematic diagram of the write address controller in FIG. 8. The write address controller 522 includes a NOR logic gate NOR12 for carrying out a NOR logic operation of the first shifted write command signal EWT and an initial reset signal RST, a sixth inverter INV19 for inverting an output of the shifted read command signal IRDP, a NAND logic gate NAND14 having one input terminal connected to an output of the NOR logic gate NOR12, a NAND logic gate NAND 15 having one input terminal connected to an output of the inverter INV19 and an the other input terminal connected to an output of the NAND logic gate NAND14, and an output terminal connected to the other input terminal of the NAND logic NAND14, a NOR logic gate NOR13 for receiving signals AL<4>, AL<5>, and AL<6> having information of a predetermined values for the additive latency, an inverter INV20 for inverting an output of the NOR logic gate NOR13, a NOR logic gate NOR14 for carrying out a NOR logic operation of an output of the NAND logic gate NAND14 and an output of the inverter INV20, and an inverter INV21 for inverting an output of the inverter INV21 to output the address control signal EWTS.

Figure 10:
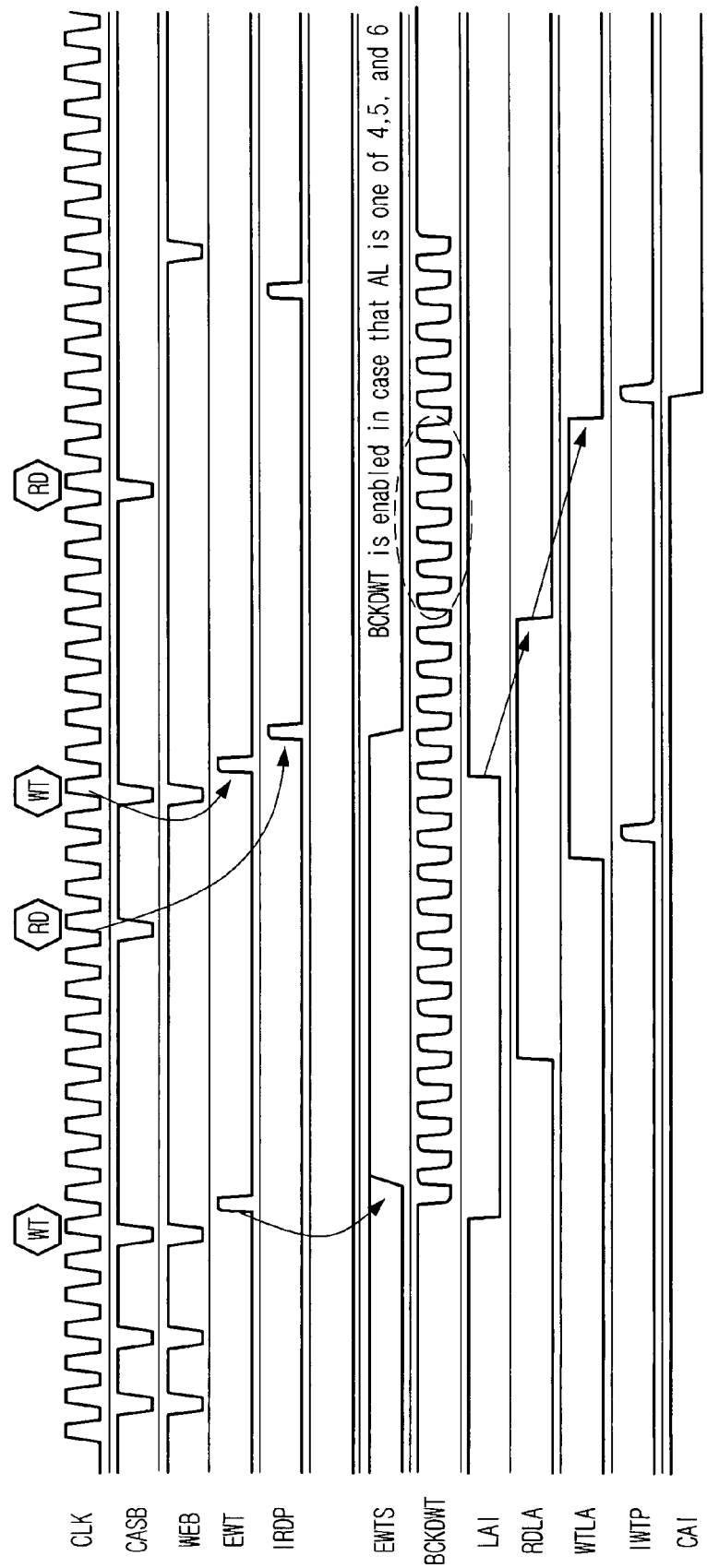
FIG. 10 shows a waveform diagram representing an operation of the semiconductor memory device in FIG. 8.

FIG. 10 shows a waveform diagram representing an operation of the semiconductor memory device in FIG. 8. In case that a value of the additive latency is greater than a value of BL/2+2, the address control signal EWTS is maintained in an activated state regardless of the state of shifted read command signal IRDP, for a predetermined period. Therefore, in case of the read to write command, although the shifted read command signal IRDP corresponding to the prior read command is activated later than the address control signal EWTS corresponding to the following write command, the address ADD inputted into the address buffer 502 can be confidently transferred into the column line selecting unit 512.

Thus, a semiconductor memory device according to the present invention can reliably carry out an operation for the read to write command.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a read command AL shifting unit for shifting a read command by a predetermined additive latency, to output a shifted read command;
   a write command AL shifting unit for shifting a write command by the predetermined additive latency, to output a first shifted write command;
   a write command CL shifting unit for shifting the first shifted write command by a predetermined cas latency, to output a second shifted write command;
   a write address controller for generating an address control signal in response to the shifted read command and the first shifted write command; and
   an address transfer circuit for transferring an address in response to the address control signal.

2. The semiconductor memory device of claim 1, wherein the address transfer circuit includes:
   an address latching unit for latching an address in response to the write command or the read command, to output a latched address;
   an address shifting clock generating unit for generating an address shifting clock and a write address shifting clock using an internal clock, in response to the address control signal;
   an AL shifting unit for shifting the latched address by the predetermined additive latency, to output a read address in response to the address shifting clock;
   a CL shifting unit for shifting the read address by the predetermined cas latency, to output a write address in response to the write address shifting clock; and
   a column line selecting unit for selecting one of a plurality of column lines using the read address or the write address, in response to the shifted read command or the second shifted write command.

3. The semiconductor memory device of claim 2, wherein the write command AL shifting unit includes a shifting register for shifting the write command, synchronized with the internal clock.

4. The semiconductor memory device of claim 3, wherein the address shifting clock generating unit includes:
   a first inverter for inverting an inverting signal of the internal clock;
   a second inverter for inverting an output signal of the first inverter;
   a third inverter for inverting an output signal of the second inverter;
   a first NAND logic gate for carrying out a NAND logic operation of an inverting signal of the internal clock and the address control signal;
   a fourth inverter for inverting an output of the NAND logic gate; and
   a fifth inverter for inverting an output of the fourth inverter to output the write address shifting clock.

5. The semiconductor memory device of claim 1, wherein the write address controller includes:
   a first NOR logic gate for carrying out a NOR logic operation of the first shifted write command and an initial reset signal;
   a sixth inverter for inverting an output of the shifted read command;
   a second NAND logic gate having one input terminal connected to an output of the first NOR logic gate;
   a third NAND logic gate having one input terminal connected to an output of the sixth inverter and an the other input terminal connected to an output of the second NAND logic gate, and an output terminal connected to the other input terminal of the second NAND logic;
   a seventh inverter for inverting an output of the second NAND logic gate; and
   an eighth inverter for inverting an output of the seventh inverter to output the address control signal.

6. A semiconductor memory device, comprising:
   a read command AL shifting unit for shifting a read command by a predetermined additive latency, to output a shifted read command;
   a write command shifting unit for shifting a write command by the predetermined additive latency and by a predetermined cas latency, to output a shifted write command;
   a write address controller for generating an address control signal in response to the shifted read command and the write command, wherein if a value of the additive latency is greater than a value of (BL/2)+2 where BL refers to a predetermined burst length, the address control signal is maintained in an activated state for a predetermined period, regardless of the state of the shifted read command; and
   an address transfer circuit for transferring an address in response to the address control signal.

7. The semiconductor memory device of claim 6, wherein the write command shifting unit includes:
   a write command AL shifting unit for shifting a write command by the predetermined additive latency, to output a first shifted write command; and
   a write command CL shifting unit for shifting the first shifted write command by the predetermined cas latency, to output a second shifted write command.

8. The semiconductor memory device of claim 6, wherein the write command shifting unit includes:
   a write command AL shifting unit for shifting a write command by the predetermined cas latency to output a first shifted write command; and
   a write command CL shifting unit for shifting the first shifted write command by the predetermined additive latency, to output a second shifted write command.

9. The semiconductor memory device of claim 7, wherein the address transfer circuit includes:
   an address latching unit for latching an address in response to the write command or the read command to output a latched address;
   an address shifting clock generating unit for generating an address shifting clock and a write address shifting clock using an internal clock, in response to the address control signal;
   an AL shifting unit for shifting the latched address by the predetermined additive latency, to output a read address in response to the address shifting clock;
   a CL shifting unit for shifting the read address by the predetermined cas latency, to output a write address in response to the write address shifting clock; and
   a column line selecting unit for selecting one of a plurality of column lines with the read address or the write address, in response to the shifted read command or the second shifted write command.

10. The semiconductor memory device of claim 7, wherein the write command AL shifting unit includes a shifting register for shifting the write command, synchronized with an internal clock.

11. The semiconductor memory device of claim 8, wherein the write command AL shifting unit includes a shifting register for shifting the write command, synchronized with an internal clock.

12. The semiconductor memory device of claim 9, wherein the address shifting clock generating unit includes:
   a first inverter for inverting an inverting signal of the internal clock;
   a second inverter for inverting an output signal of the first inverter;
   a third inverter for inverting an output signal of the second inverter;
   a first NAND logic gate for carrying out a NAND logic operation of the inverting signal of the internal clock and the address control signal;
   a fourth inverter for inverting an output of the NAND logic gate; and
   a fifth inverter for inverting an output of the fourth inverter to output the write address shifting clock.

13. The semiconductor memory device of claim 12, wherein the write address controller includes:
   a first NOR logic gate for carrying out a NOR logic operation of the first shifted write command and an initial reset signal;
   a sixth inverter for inverting an output of the shifted read command;
   a second NAND logic gate having one input terminal connected to an output of the first NOR logic gate;
   a third NAND logic gate having one input terminal connected to an output of the sixth inverter and an the other input terminal connected to an output of the second NAND logic gate, and an output terminal connected to the other input terminal of the second NAND logic;
   a second NOR logic gate for receiving signals having information of a predetermined values for additive latency;
   a seventh inverter for inverting an output of the second NOR logic gate;
   a third NOR logic gate for carrying out a NOR logic operation of an output of the second NAND logic gate and an output of the seventh inverter; and
   an eighth inverter for inverting an output of the seventh inverter to output the address control signal.

14. The semiconductor memory device of claim 12, wherein the additive latency has one of 4, 5, and 6.

15. A method for operating a semiconductor memory device, comprising:
   shifting a read command for a predetermined additive latency, to output a shifted read command;
   shifting a write command for the predetermined additive latency, to output a first shifted write command;
   shifting the first shifted write command for a predetermined cas latency, to output a second shifted write command;
   generating an address control signal in response to the shifted read command and the first shifted write command; and
   transferring an address in response to the address control signal.

16. The method of claim 15, wherein transferring an address in response to the address control signal includes:
   latching an address in response to the write command or the read command to output a latched address;
   generating an address shifting clock and a write address shifting clock using an internal clock, in response to the address control signal;
   shifting the latched address for the predetermined additive latency, to output a read address in response to the address shifting clock;
   shifting the read address for the predetermined cas latency, to output a write address in response to the write address shifting clock; and
   selecting one of a plurality of column lines with the read address or the write address, in response to the shifted read command or the second shifted write command.

17. The method of claim 16, wherein the first shifted write command is synchronized with the internal clock.

18. A method for operating a semiconductor memory device, comprising:
   shifting a read command for a predetermined additive latency to output a shifted read command;
   shifting a write command for the predetermined additive latency and for a predetermined cas latency, to output a shifted write command;
   generating an address control signal in response to the shifted read command and the shifted write command, wherein if a value of the additive latency is greater than a value of (BL/2)+2, where BL refers to a predetermined burst length, the address control signal is maintained in an activate state regardless of the state of shifted read command; and
   transferring an address in response to the address control signal.

19. The method of claim 18, wherein the shifting a write command comprises:
   shifting a write command for the predetermined additive latency to output a first shifted write command; and
   shifting the first shifted write command for the predetermined cas latency to output a second shifted write command.

20. The method of claim 18, wherein the shifting a write command comprises:
   shifting a write command for the predetermined cas latency to output a first shifted write command; and
   shifting the first shifted write command for the predetermined additive latency to output a second shifted write command.

21. The method of claim 19, wherein the transferring an address in response to the address control signal comprises:
   latching an address in response to the write command or the read command to output a latched address;
   generating an address shifting clock and a write address shifting clock with an internal clock, in response to the address control signal;
   shifting the latched address for the predetermined additive latency to output a read address in response to the address shifting clock;
   shifting the read address for the predetermined cas latency to output a write address in response to the write address shifting clock; and
   selecting one or more of a plurality of column lines with the read address or the write address in response to the shifted read command or the second shifted write command.

22. The method of claim 21, wherein the first shifted write command is synchronized with the internal clock.

* * * * *